(12) United States Patent
Kim et al.

(10) Patent No.: US 12,206,384 B2
(45) Date of Patent: Jan. 21, 2025

(54) IMPEDANCE CONVERTER FOR ANTENNA, ANTENNA MODULE INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Sung Hoe Kim, Seoul (KR); Na Yeon Kim, Seoul (KR); Dae Kyu Kim, Gyeonggi-do (KR); Byung Eun Jeon, Seoul (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 211 days.

(21) Appl. No.: 18/100,665

(22) Filed: Jan. 24, 2023

(65) Prior Publication Data

US 2023/0246623 A1 Aug. 3, 2023

(30) Foreign Application Priority Data

Jan. 28, 2022 (KR) .................. 10-2022-0013342

(51) Int. Cl.
*H01Q 1/24* (2006.01)
*H01P 5/12* (2006.01)
*H03H 7/38* (2006.01)

(52) U.S. Cl.
CPC .............. *H03H 7/38* (2013.01); *H01Q 1/243* (2013.01)

(58) Field of Classification Search
CPC . H01P 5/12; H01Q 1/24; H01Q 1/243; H01Q 1/38; H01Q 1/46; H01Q 1/50; H01Q 21/08; H01Q 9/04; H01Q 9/0407; H03H 7/38

See application file for complete search history.

(56) References Cited

U.S. PATENT DOCUMENTS

| 6,002,375 | A | * | 12/1999 | Corman | ................... H01Q 1/38 257/728 |
| 6,621,467 | B1 | * | 9/2003 | Marsh | ................ G06K 19/0726 343/860 |
| 10,340,877 | B2 | * | 7/2019 | Ishizuka | .............. H04B 1/0458 |
| 11,688,916 | B2 | * | 6/2023 | Niida | ........................ H01P 1/00 343/850 |

FOREIGN PATENT DOCUMENTS

KR 10-2019-0009232 A 1/2019

\* cited by examiner

*Primary Examiner* — Tho G Phan
(74) *Attorney, Agent, or Firm* — The PL Law Group, PLLC

(57) ABSTRACT

An impedance converter for an antenna includes a first port receiving a power from an antenna driving integrated circuit, an impedance modulator connected to the first port to convert an impedance, and a second port connected to the modulator and configured to perform a feeding to an antenna unit. The second port has an impedance higher than that of the first port. Impedance mismatching is prevented by the impedance modulator to improve antenna properties.

17 Claims, 8 Drawing Sheets

IMPEDANCE CONVERTER FOR ANTENNA, ANTENNA MODULE INCLUDING THE SAME AND IMAGE DISPLAY DEVICE INCLUDING THE SAME

CROSS-REFERENCE TO RELATED APPLICATION AND CLAIM OF PRIORITY

This application claims the benefit under 35 USC § 119 of Korean Patent Application No. 10-2022-0013342 filed on Jan. 28, 2022 in the Korean Intellectual Property Office, the entire disclosures of which is incorporated herein by reference for all purposes.

BACKGROUND

1. Field

The present invention relates to an impedance converter for an antenna, an antenna module including the same and an image display device including the same. More particularly, the present invention relates to an impedance converter for an antenna including an impedance variable circuit, an antenna module including the same and image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

According to developments of a mobile communication technology, an antenna capable of implementing, e.g., high frequency or ultra-high frequency band communication is needed in the display device.

To increase sensitivity and gain of a radiator included in an antenna, the radiator may be disposed within a display area of a front portion of an image display device. In this case, a signal loss of an antenna operable in the high frequency or ultra-high frequency band may occur due to an insulating structure or a conductive structure of the image display device disposed at the front portion.

Further, when a feeding is performed to the antenna from an antenna driving integrated circuit disposed at a rear portion of the image display device, radiation properties and impedance set in the high frequency or ultra-high frequency band may be disturbed in a bonding region of a feeding circuit and the antenna.

Accordingly, antenna radiation properties in a desired high frequency or ultra-high frequency band may be disturbed or the antenna gain may be reduced.

SUMMARY

According to an aspect of the present invention, there is provided an impedance converter for an antenna having improved radiation property and electrical reliability.

According to an aspect of the present invention, there is provided an antenna module including an impedance converter for an antenna having improved radiation property and electrical reliability.

According to an aspect of the present invention, there is provided an image display device including an impedance converter for an antenna having improved radiation property and electrical reliability.

(1) An impedance converter for an antenna, including a first port receiving a power from an antenna driving integrated circuit; an impedance modulator connected to the first port to convert an impedance; and a second port connected to the modulator and configured to perform a feeding to an antenna unit, the second port having an impedance higher than that of the first port.

(2) The impedance converter for an antenna of the above (1), wherein the impedance modulator includes a first modulator disposed to be adjacent to the first port, and a second modulator disposed to be adjacent to the second port.

(3) The impedance converter for an antenna of the above (2), further including: a first signal wiring connecting the first port and the first modulator; a second signal wiring connecting the first modulator and the second modulator and including branched wirings; and a third signal wiring connecting the second modulator and the second port and including feeding wirings.

(4) The impedance converter for an antenna of the above (3), wherein the second modulator is connected to each of the branched wirings, and a plurality of the feeding wirings are branched from the second modulator.

(5) The impedance converter for an antenna of the above (4), wherein the second port includes a plurality of second ports, each of which is connected to each end portion of the feeding wirings.

(6) The impedance converter for an antenna of the above (5), wherein the first port has a first impedance, the second signal wiring has a second impedance greater than the first impedance, and the first modulator has a first modulating impedance smaller than each of the first impedance and the second impedance.

(7) The impedance converter for an antenna of claim 6, wherein the first modulating impedance satisfies Equation 1-1:

$$\sqrt{\frac{Z_2}{2} * Z_1} - 2\Omega \le T_1 \le \sqrt{\frac{Z_2}{2} * Z_1} + 2\Omega \qquad \text{[Equation 1-1]}$$

In Equation 1-1, $Z_1$ and $Z_2$ are the first impedance and the second impedance, respectively, and $T_1$ is the first modulating impedance.

(8) The impedance converter for an antenna of the above (6), wherein the third signal wiring and the second port has a third impedance, and the second modulator has a second modulating impedance smaller than each of the second impedance and the third impedance.

(9) The impedance converter for an antenna of the above (8), wherein the second modulating impedance satisfies Equation 3-1:

$$\sqrt{\frac{Z_3}{2} * Z_2} - 2\Omega \le T_2 \le \sqrt{\frac{Z_3}{2} * Z_2} + 2\Omega \qquad \text{[Equation 3-1]}$$

In Equation 3-1, $Z_2$ and $Z_3$ are the second impedance and the third impedance, respectively, and $T_2$ is the second modulating impedance.

(10) The impedance converter for an antenna of the above (8), wherein the third impedance is determined based on Equation 2:

$$Z_2 = \sqrt{Z_3 * Z_1} \qquad \text{[Equation 2]}$$

In Equation 2, $Z_1$, $Z_2$ and $Z_3$ are the first impedance, the second impedance and the third impedance, respectively.

(11) The impedance converter for an antenna of the above (1), further including: a first signal wiring that is a single wiring connecting the first port and the impedance modulator; and a second signal wiring that is a single wiring connecting the impedance modulator and the second port.

(12) The impedance converter for an antenna of the above (11), wherein the first port has a first impedance, the second port has a second impedance greater than the first impedance, and the impedance modulator has a modulating impedance between the first impedance and the second impedance.

(13) The impedance converter for an antenna of the above (12), wherein the modulating impedance satisfies Equation 5-1:

$$\sqrt{Z_1 * Z_2} - 2\Omega \le T \le \sqrt{Z_1 * Z_2} + 2\Omega \quad \text{[Equation 5-1]}$$

In Equation 5-1, $Z_1$ and $Z_2$ are the first impedance and the second impedance, respectively, and T is the modulating impedance.

(14) The impedance converter for an antenna of the above (1), wherein the impedance converter for an antenna is used in an antenna-on display (AOD) device.

(15) An antenna module, including: the impedance converter for an antenna according to the above embodiments; an antenna driving integrated circuit connected to the first port of the impedance converter for an antenna; and an antenna-on display (AOD) device coupled to the second port of the impedance converter for an antenna.

(16) An image display device, including: a display panel having a display area and a peripheral area; and the antenna module of the above embodiment combined with the display panel.

(17) The image display device of the above (16) wherein the AOD device is disposed at least partially within the display area at a front portion of the image display device, and the impedance converter for an antenna is bonded to the AOD device in the peripheral area, and is bent to a rear portion of the image display device to be connected to the antenna driving integrated circuit.

According to embodiments of the present invention, an impedance converter for an antenna may have different impedances at an input port and an output port. In exemplary embodiments, an impedance at the output port may be greater than an impedance at the input port. The output port may be bonded to a signal pad of an antenna unit, and an impedance mismatching occurring in a bonding region with the signal pad may be reduced or suppressed. Thus, radiation properties of the antenna unit in a high frequency or ultra-high frequency band may be improved, and a signal loss may be suppressed.

In some embodiments, the impedance converter for an antenna may include an impedance modulator between the output port and the input port, and an impedance value at the output port may be efficiently obtained by the impedance modulator.

In some embodiments, the impedance converter for the antenna may be used as a power divider or a modulator for an antenna-on display (AOD) of 20 GHz or higher. Accordingly, antenna radiation properties in a high frequency or ultra-high frequency band in, e.g., a range from 30 GHz to 40 GHz may be implemented with high reliability.

DETAILED DESCRIPTION

According to exemplary embodiments of the present invention, an impedance converter for an antenna capable of providing different impedances at an input terminal and an output terminal is provided. According to exemplary embodiments of the present invention, an antenna module including the impedance converter is also provided.

Further, according to exemplary embodiments of the present invention, an image display device including the antenna module is provided.

In exemplary embodiments, an antenna radiator of the antenna module may be disposed in a display area of the image display device. Accordingly, the antenna module may be provided as an antenna for an AOD (Antenna-On Display).

In some embodiments, the impedance converter for the antenna may be combined with an antenna device to provide an antenna module fabricated in the form of a microstrip patch. The antenna device or the antenna module may be applied to a mobile communication device operable in 3G, 4G, 5G or higher high-frequency or ultra-high frequency bands.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
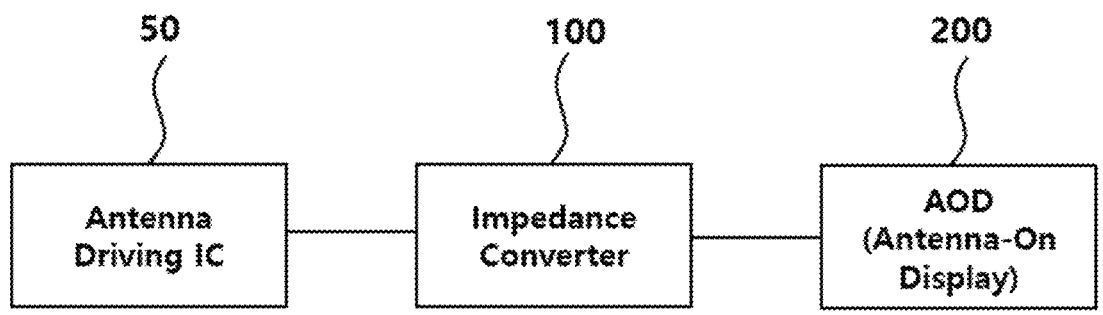
FIG. 1 is a schematic diagram illustrating a construction of an antenna module including an impedance converter in accordance with exemplary embodiments.

FIG. 1 is a schematic diagram illustrating a construction of an antenna module including an impedance converter in accordance with exemplary embodiments.

Referring to FIG. 1, an impedance converter 100 for an antenna according to exemplary embodiments (hereinafter, that may be abbreviated as an impedance converter) may be coupled to an antenna device 200. As illustrated in FIG. 1, the antenna device 200 may be an antenna device for an antenna-on display (AOD). The impedance converter 100 may be connected to an antenna driving integrated circuit 50.

In exemplary embodiments, the impedance converter 100 may be provided as a feeding device, a mediator or a power distributor between the antenna driving IC 50 and the antenna device 200. The impedance converter 100 may receive a power or a voltage from the antenna driving IC 50 and transfer the power or the voltage to the antenna device 200. Accordingly, a feeding to the antenna device 200 may be performed, and a driving signal for an antenna radiation may also be transmitted from the antenna driving IC 50 to the antenna device 200 through the impedance converter 100.

Figure 2:
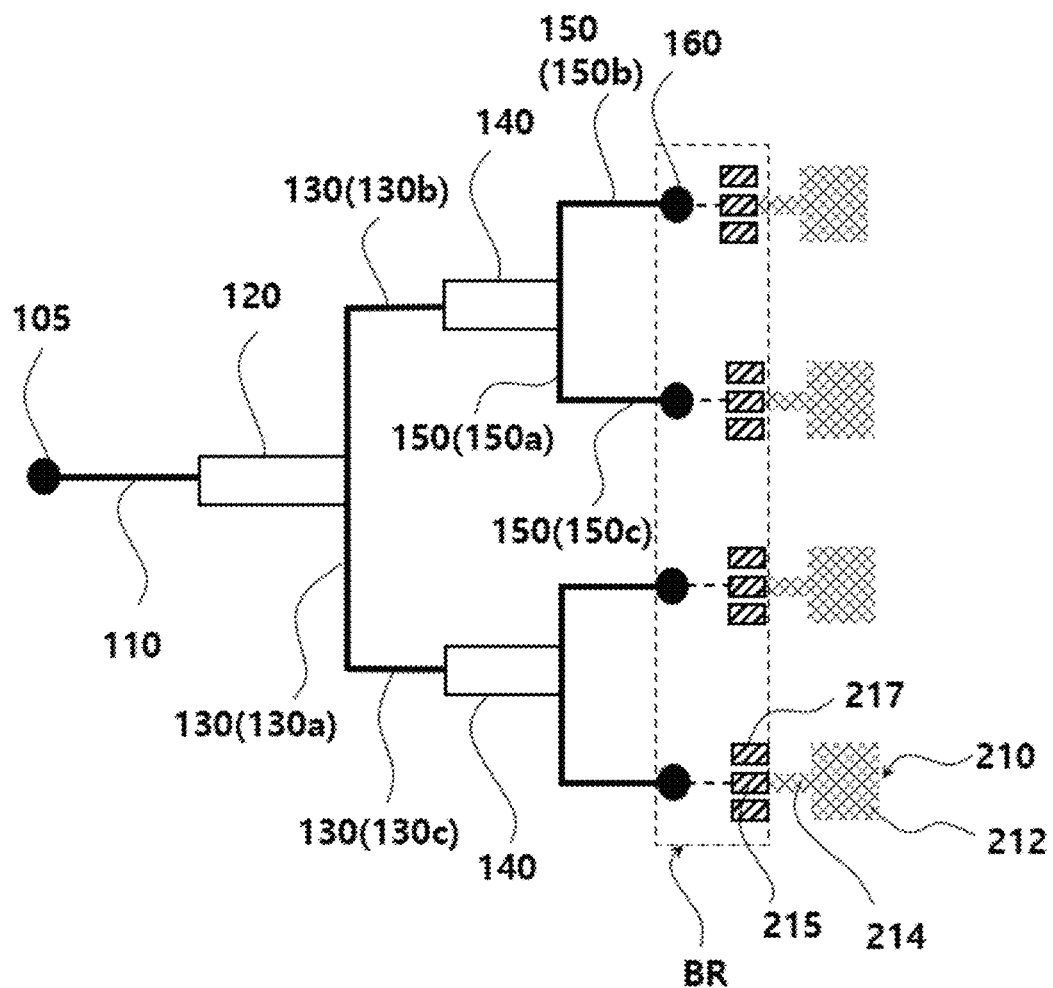
FIG. 2 is a schematic circuit diagram illustrating an impedance converter for an antenna in accordance with exemplary embodiments.

FIG. 2 is a schematic circuit diagram illustrating an impedance converter for an antenna in accordance with exemplary embodiments.

For example, FIG. 2 illustrates a passive type impedance converter in which a power is supplied from one first port 105 to a plurality of second ports 160 or a plurality of antenna units 210.

Referring to FIG. 2, the impedance converter 100 may include the first port 105, impedance modulators 120 and 140, and the second port 160. The impedance modulators 120 and 140 may include a first modulator 120 and a second modulator 140.

The first port 105 may serve as an input port receiving the power from the antenna driving IC 50. The first port 105 may be disposed to be adjacent to the antenna driving IC 50, and may be directly connected to the antenna driving IC 50. For example, a feeding pad included in the antenna driving IC 50 and the first port 105 may be connected to each other.

In some embodiments, the first port 105 and the antenna driving IC 50 may be electrically connected to each other through a connector.

The first port 105 may be connected to the first modulator 120 through a first signal wiring 110. An impedance of a feeding signal transmitted through the first port 105 and the first signal wiring 110 may be adjusted by the first modulator 120 to be transferred to a second signal wiring 130.

In exemplary embodiments, an impedance (a first impedance) of the first port 105 and an impedance (a second impedance) of the second signal wiring 130 may be different from each other, and a conversion from the first impedance to the second impedance may be performed by the first modulator 120. In some embodiments, the second impedance may be greater than the first impedance.

In some embodiments, an impedance (a first modulating impedance) of the first modulator 120 may be smaller than each of the first impedance and the second impedance.

In exemplary embodiments, the first modulating impedance T1 may be adjusted based on Equation 1 below.

$$T_1 = \sqrt{\frac{Z_2}{2} * Z_1} \quad \text{[Equation 1]}$$

In Equation 1, $Z_1$ and $Z_2$ represent the first impedance and the second impedance, respectively, and $T_1$ represents the first modulating impedance.

In an embodiment, the first modulating impedance may satisfy Equation 1-1 below.

$$\sqrt{\frac{Z_2}{2} * Z_1} - 2\Omega \leq T_1 \leq \sqrt{\frac{Z_2}{2} * Z_1} + 2\Omega \quad \text{[Equation 1-1]}$$

In some embodiments, the first port 105 and the first signal wiring 110 have the same impedance, and may share the first impedance. The first port 105 and the first signal wiring 110 may be formed as a substantially integral wiring, and an end portion of the first signal wiring 110 may serve as the first port 105.

The first modulator 120 may be formed as an integral wiring with the first signal wiring 110, and may be directly connected to the second signal wiring 130. In an embodiment, a width of the first modulator 120 may be greater than that of the first signal wiring 110, and may be greater than that of the second signal wiring 130.

In exemplary embodiments, the second signal wiring 130 may have a branched wire shape extending from the first modulator 120. For example, the second signal wiring 130 may include a plurality of branched wirings and the branched wiring may be connected in parallel by a merge wiring 130a.

In some embodiments, as illustrated in FIG. 2, a first branched wiring 130b and a second branched wiring 130c may be connected in parallel to each other by the merge wiring 130a. The first modulator 120 may be directly connected to the merge wiring 130a.

In exemplary embodiments, the second impedance may be maintained throughout the second signal wiring 130. For example, the same width may be maintained throughout the first branched wiring 130b, the merge wiring 130a and the second branched wiring 130c, and the second impedance may be maintained.

The second signal wiring 130 may be electrically connected to a third signal wiring 150 through the second modulator 140.

An impedance of the third signal wiring 150 may be converted into a third impedance different from the second impedance through the second modulator 140. In some embodiments, the third impedance may be greater than the second impedance.

In some embodiments, the third impedance may be determined based on Equation 2 below.

$$Z_2 = \sqrt{Z_3 * Z_1} \quad \text{[Equation 2]}$$

In Equation 2, $Z_1$, $Z_2$ and $Z_3$ represent the first impedance, the second impedance and the third impedance, respectively.

In some embodiments, an impedance (a second modulating impedance) of the second modulator 140 may be smaller than each of the second impedance and the third impedance. In an embodiment, the second modulating impedance may be greater than the first modulating impedance.

In exemplary embodiments, the second modulating impedance $T_2$ may be determined based on Equation 3 below.

$$T_2 = \sqrt{\frac{Z_3}{2} * Z_2} \quad \text{[Equation 3]}$$

In Equation 3, $Z_2$ and $Z_3$ represent the second impedance and the third impedance, respectively, and $T_2$ represents the second modulating impedance.

In an embodiment, the second modulating impedance may satisfy Equation 3-1 below.

$$\sqrt{\frac{Z_3}{2} * Z_2} - 2\Omega \leq T_2 \leq \sqrt{\frac{Z_3}{2} * Z_2} + 2\Omega \quad \text{[Equation 3-1]}$$

The second modulator 140 may be formed as an integral wiring with each of the branched wirings 130*b* and 130*c* and may be directly connected to the third signal wiring 150. In an embodiment, the width of the second modulator 140 may be greater than the width of the second signal wring 130 (e.g., the width of the branched wiring), and may be greater than a width of the third signal wiring 150.

In exemplary embodiments, the third signal wiring 150 may have a branched wiring shape extending from the second modulator 140. For example, the third signal wiring 150 may include a plurality of feeding wirings, and the feeding wirings may be connected in parallel by a connection wiring 150*a*.

In some embodiments, as illustrated in FIG. 2, a first feeding wiring 150*b* and a second feeding wiring 150*c* may be connected in parallel to each other by the connection wiring 150*a*. The second modulator 140 may be directly connected to the connection wiring 150*a*.

In exemplary embodiments, the third impedance may be maintained throughout the third signal wiring 150. For example, the same width may be maintained throughout the first feeding wiring 150*b*, the connection wiring 150*a* and the second feeding wiring 150*c*, and the third impedance may be maintained.

As described above, the impedance converter may include a plurality of the second modulators 140. The third signal wiring 150 may be connected to each of the second modulators 140.

In exemplary embodiments, a feeding group is defined by the first feeding wiring 150*b*, the connection wiring 150*a* and the second feeding wiring 150*c*, and the third signal wiring 150 may include a plurality of the feeding groups, each of which may be connected to each of the second modulators 140.

The second port 160 may be provided at each terminal end portion of the feeding wirings 150*a* and 150*b*. For example, the second port 160 may be integrally connected to the terminal end portion of each of the feeding wiring 150*a* and 150*b*.

In some embodiments, the second port 160 and the third signal wiring 150 may have the same impedance, and may share the third impedance. The second port 160 and the feeding wirings 150*a* and 150*b* may be formed as a substantially integral wiring, and the terminal end portions of the feeding wires 150*a* and 150*b* may each serve as the second port 160.

The second port 160 may serve as a feeding port for the antenna unit 210. In exemplary embodiments, a plurality of the second ports 160 may be arranged to correspond to the first port 105, and the antenna unit 210 may be individually connected to each of the second ports 160.

The antenna unit 210 may include a radiator 212, a transmission line 214 and a signal pad 215.

For example, as illustrated in FIG. 2, the radiator 212 may have a polygonal shape such as a quadrangle shape. In exemplary embodiments, the radiator 212 may have a mesh structure. The transmission line 214 may have a smaller width than that of the radiator 212, and may be connected to one side of the radiator 212. The transmission line 214 may extend in, e.g., a straight line shape, and may be formed as an integral member with the radiator 212.

The signal pad 215 may be directly connected to an end portion of the transmission line 214. For example, the signal pad 215 may be formed as a solid conductive pattern, and the transmission line 214 may have a mesh structure as illustrated in FIG. 2. In an embodiment, at least a portion of the transmission line 214 may be a solid conductive pattern.

In some embodiments, a ground pad 217 may be disposed around the signal pad 215. For example, a pair of the ground pads 217 may be disposed with the signal pad 215 interposed therebetween.

The second port 160 may be electrically connected to the signal pad 215 in a bonding region BR. For example, the second port 160 and the signal pad 215 may be bonded to each other using an anisotropic conductive film (ACF).

In the bonding region BR, an insulating structure or a dielectric structure may be disposed above and below the signal pad 215 of the antenna unit 210, and the ACF may be disposed as described above. Accordingly, an impedance of the antenna unit 210 in the bonding region BR may be disturbed or increased.

In exemplary embodiments, the impedance of the second port 160 may be matched with the impedance of the antenna unit 210 in the bonding region BR through the above-described impedance modulation mechanism in the impedance converter 100.

In exemplary embodiments, the impedance of the second port 160 may be greater than that of the first port 105. As described above, the first port 105 may be set to the relatively small first impedance to increase a power receiving efficiency from the antenna driving IC 50 and reduce a power loss. Thereafter, the second port 160 may be set to the relatively increased third impedance through the first and second modulators 120 and 140.

Thus, signal loss and antenna gain reduction due to the impedance mismatching in the bonding region BR may be prevented, and the power loss supplied from the antenna driving IC 50 may be reduced. Further, a stepwise impedance conversion may be performed through the modulators 120 and 140, so that signal loss due to an impedance modulation may be prevented.

In some embodiments, a length of each of the modulators 120 and 140 may be adjusted to a length corresponding to a quarter wavelength of a wavelength corresponding to a resonance frequency of the antenna unit 210.

For example, the length D of each of the modulators 120 and 140 may be determined based on Equation 4 below.

$$D = \frac{\lambda}{4\sqrt{\varepsilon_r}} \qquad \text{[Equation 4]}$$

In Equation 4, λ is a wavelength corresponding to a target frequency of the antenna device or the antenna unit, and $\varepsilon_r$ is a relative permittivity of a substrate on which the impedance converter for the antenna is disposed.

Figure 3:
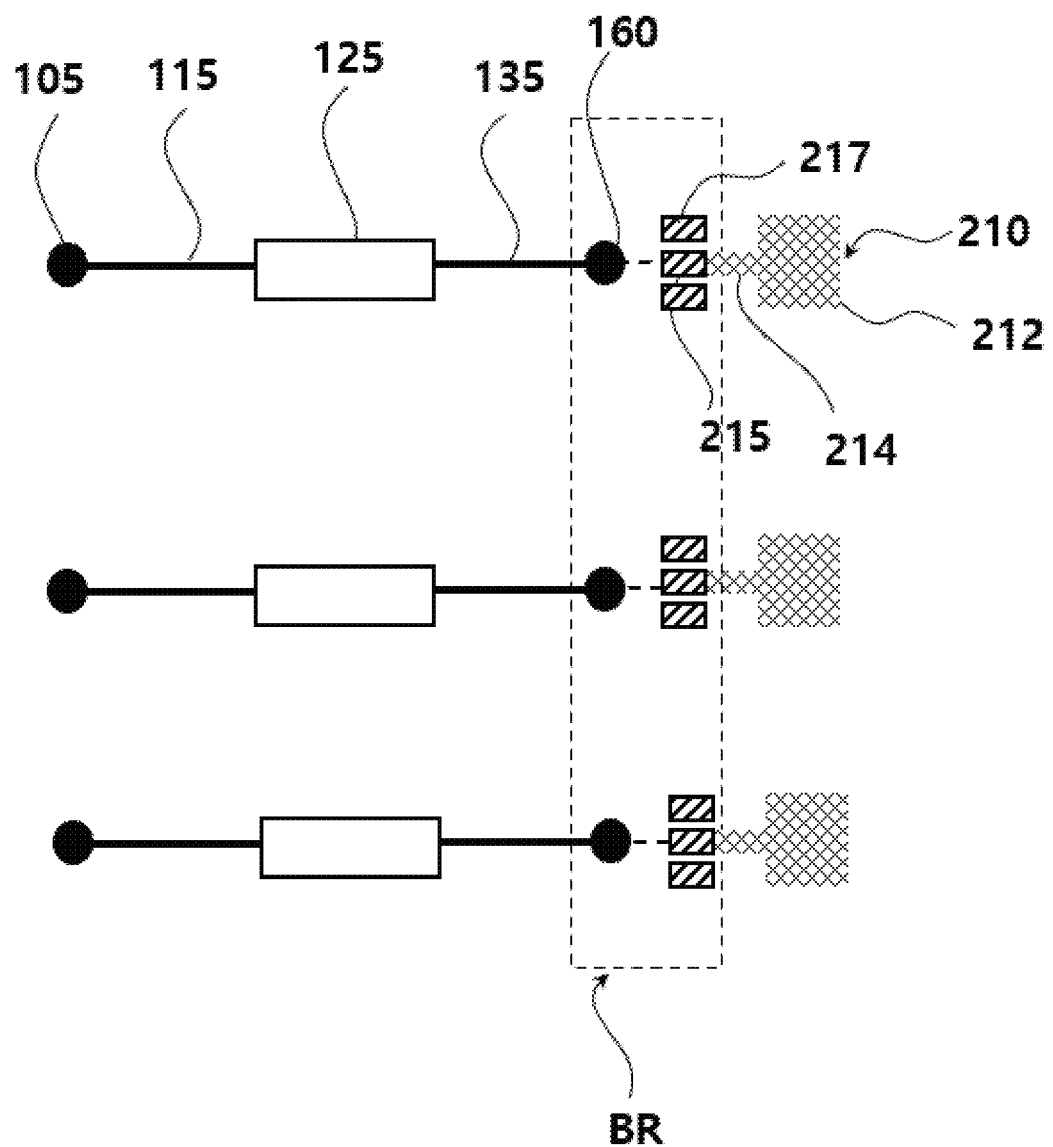
FIG. 3 is a schematic circuit diagram illustrating an impedance converter for an antenna in accordance with exemplary embodiments.

FIG. 3 is a schematic circuit diagram illustrating an impedance converter for an antenna in accordance with exemplary embodiments.

For example, FIG. 3 illustrates an active type impedance converter in which one second port 160 or one antenna unit 210 is independently connected from one first port 105. Detailed descriptions on elements/operations substantially the same as or similar to those described with reference to FIG. 2 are omitted herein.

Referring to FIG. 3, an impedance modulator 125 may be disposed between the first port 105 and the second port 160. The first port 105 and the impedance modulator 125 may be connected through a first signal wiring 115, and the impedance modulator 125 and the second port 160 may be connected through a second signal wiring 135. Each of the first signal wiring 115 and the second signal wiring 135 may be a single non-branched wire extending in a straight line shape.

The first port 105 may have a first impedance. The first port 105 and the first signal wiring 115 may share the first impedance, and may be integral wirings having substantially the same width.

An impedance increased from the first impedance by the impedance modulator 125 may be transferred to the second signal wiring 135 and the second port 160. The first impedance may be converted into a modulating impedance greater than the first impedance by the impedance modulator 125, and the modulating impedance may be increased in the second signal wiring 135.

Accordingly, the second signal wiring 135 may have a second impedance greater than each of the modulating impedance and the first impedance. The second port 160 and the second signal wiring 135 may share the second impedance, and may be integral wirings having substantially the same width.

For example, the modulating impedance (T) may be determined according to Equation 5 below.

$$T = \sqrt{Z_1 * Z_2} \qquad \text{[Equation 5]}$$

In Equation 5, $Z_1$ and $Z_2$ represent the first impedance and the second impedance, respectively.

In an embodiment, the modulating impedance may satisfy Equation 5-1 below.

$$\sqrt{Z_1 * Z_2} - 2\Omega \le T \le \sqrt{Z_1 * Z_2} + 2\Omega \qquad \text{[Equation 5-1]}$$

The impedance modulator 125 may be provided as an integral wiring with each of the signal wirings 115 and 135, and may be directly connected to the signal wirings 115 and 135. In an embodiment, a width of the impedance modulator 125 may be smaller than that of the first signal wiring 115 and may be greater than that of the second signal wiring 135.

For example, the widths of the first signal wiring 115, the impedance modulator 125 and the second signal wiring 135 may sequentially decrease.

As illustrated FIG. 3, the impedance converter may include a conversion unit that includes a structure of the first port 105—the first signal wiring 115—the impedance modulator 125—the second signal wiring 135—the second port 160. A plurality of the conversion units may be arranged to be physically and electrically independent from each other.

Each conversion unit may be electrically connected to the antenna unit 210, and a feeding may be performed individually and independently through the signal pad 215 of the antenna unit 210. As described above, the second port 160 may be bonded to the signal pad 215 in the bonding region BR and may have the second impedance greater than the first impedance of the first port 105. Accordingly, the signal loss in the antenna unit 210 may be suppressed and the antenna gain may be increased through the impedance matching in the bonding region BR.

As described above, the length of the impedance modulator 125 may be adjusted to a length corresponding to a quarter wavelength of a wavelength corresponding to the resonance frequency of the antenna unit 210, and may be determined through Equation 4 above.

Figure 4:
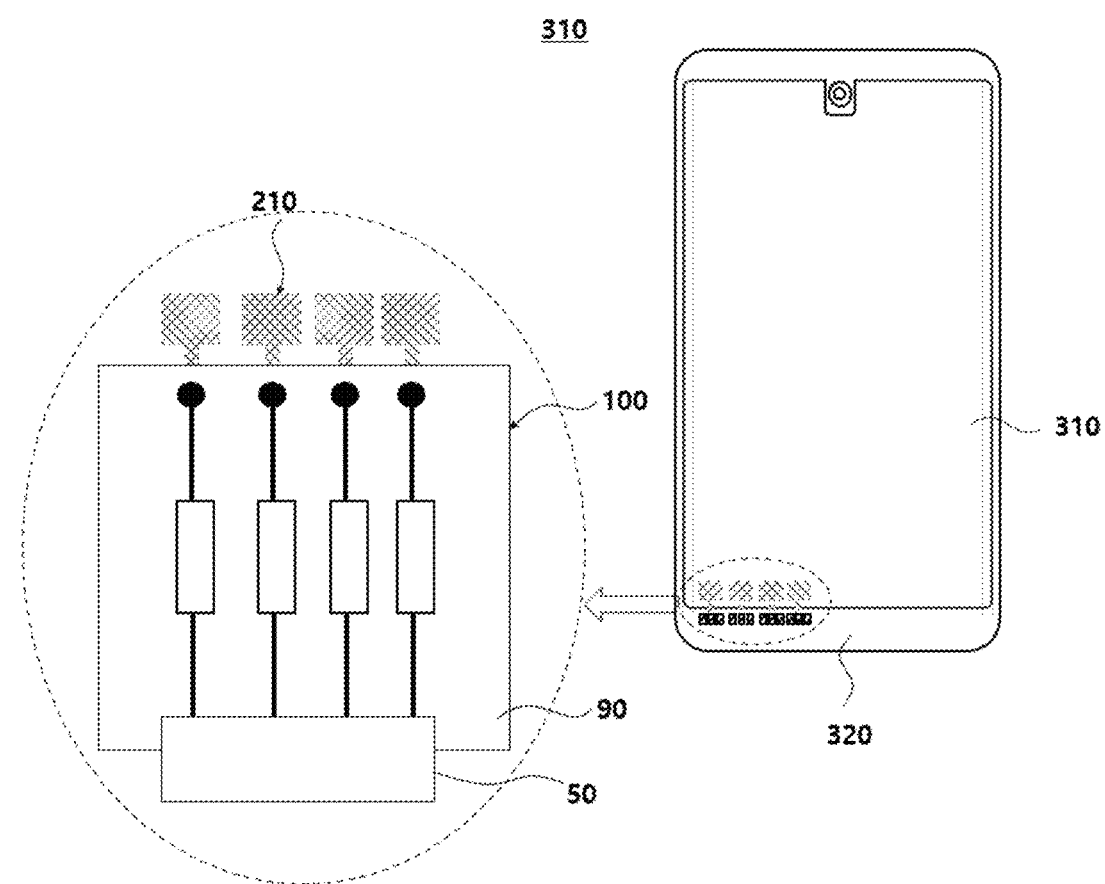
FIG. 4 is a schematic plan view illustrating an antenna module and an image display device in accordance with exemplary embodiments.

FIG. 4 is a schematic plan view illustrating an antenna module and an image display device in accordance with exemplary embodiments.

Referring to FIG. 4, the image display device includes a display panel 300, and may be implemented in the form of, e.g., a smart phone. A front portion or a window surface of the display panel 300 may include a display area 310 and a peripheral area 320. The peripheral area 320 may correspond to, e.g., a light-shielding portion or a bezel portion of the display panel, and may be adjacent to both lateral portions and/or both end portions of the display area 310.

At least a portion of the antenna unit 210 may be disposed within the display area 310. For example, the radiator 212 of the antenna unit 210 may have a mesh structure and may be disposed within the display area 310. Accordingly, radiation efficiency and gain may be improved through the front portion of the display panel 300, and degradation of an image quality caused by the radiator 212 may be prevented.

The pads 215 and 217 of the antenna unit 210 may be arranged in the peripheral area 320. As described above, the pads 215 and 217 have a solid conductive pattern structure and may be disposed in the peripheral area 320 to be prevented from being visually recognized by a user and to increase a feeding efficiency.

The impedance converter 100 may be bonded to the signal pad 215 of the antenna unit 210 in the peripheral area 320 and may be bent, e.g., to a rear portion of the display panel 300, and thus may be electrically connected to the antenna driving IC 50 disposed below a panel substrate of the display panel 300 or at the rear portion.

Thus, a power supplied from the antenna driving IC 50 may be transmitted to the antenna unit 210 through the impedance modulation in the impedance converter 100.

As illustrated in FIG. 4, the impedance converter 100 may include a substrate 90, and the above circuit structure may be arranged on the substrate 90.

In FIG. 4, the active-type impedance converter described with reference to FIG. 3 is provided. However, the passive-type impedance converter described with reference to FIG. 2 may be included in an antenna module or an image display device.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

EXAMPLE AND COMPARATIVE EXAMPLE

Figure 5:
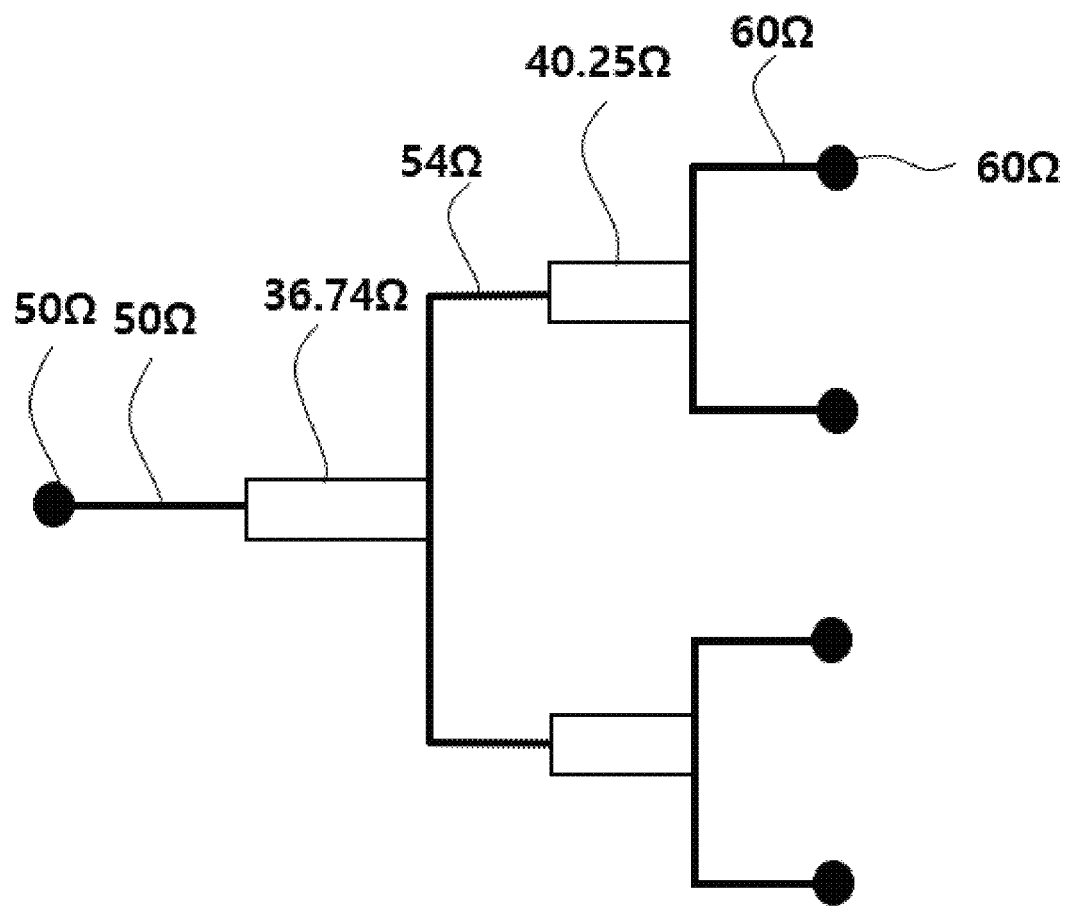
FIGS. 5 and 6 are schematic circuit diagrams illustrating constructions of impedance converters according to Example and Comparative Example, respectively.
Figure 6:
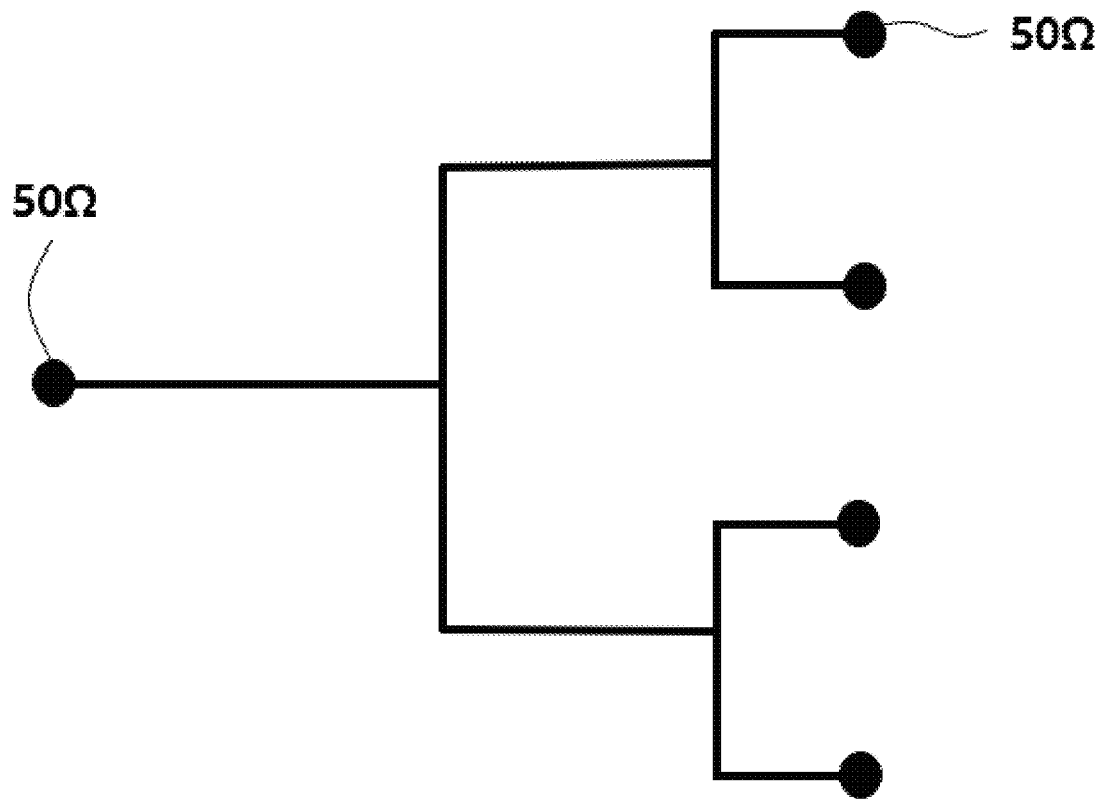

FIGS. 5 and 6 are schematic circuit diagrams illustrating constructions of impedance converters according to Example and Comparative Example, respectively.

Referring to FIG. 5, as described with reference to FIG. 2, in the impedance converter according to Example, the impedance of the second port 160 was set higher than the impedance of the first port 105 through the modulators 120 and 140.

Specifically, the impedance of the first port 105 was set to 50Ω and width of wirings were adjusted such that the impedances of the modulators 120 and 140 and the signal wirings 130 and 150 were adjusted based on Equations 1, 2 and 3 as described above. Accordingly, the impedance of the second port 160 was adjusted to 60Ω.

Referring to FIG. 6, the impedance converter of Comparative Example had the same wiring width entirely, and the impedance was maintained at 50Ω from the first port 105 to the second port 160.

Experimental Example

The impedance converters according to Example and Comparative Example were each bonded to the same antenna units of the structure shown in FIG. 2, respectively.

Thereafter, while supplying a power through the first port 105, a signal loss (Return Loss; S11) according to frequency was simulated using HFSS, and an antenna gain value according to the frequency was extracted in a radiation chamber.

Figure 7:
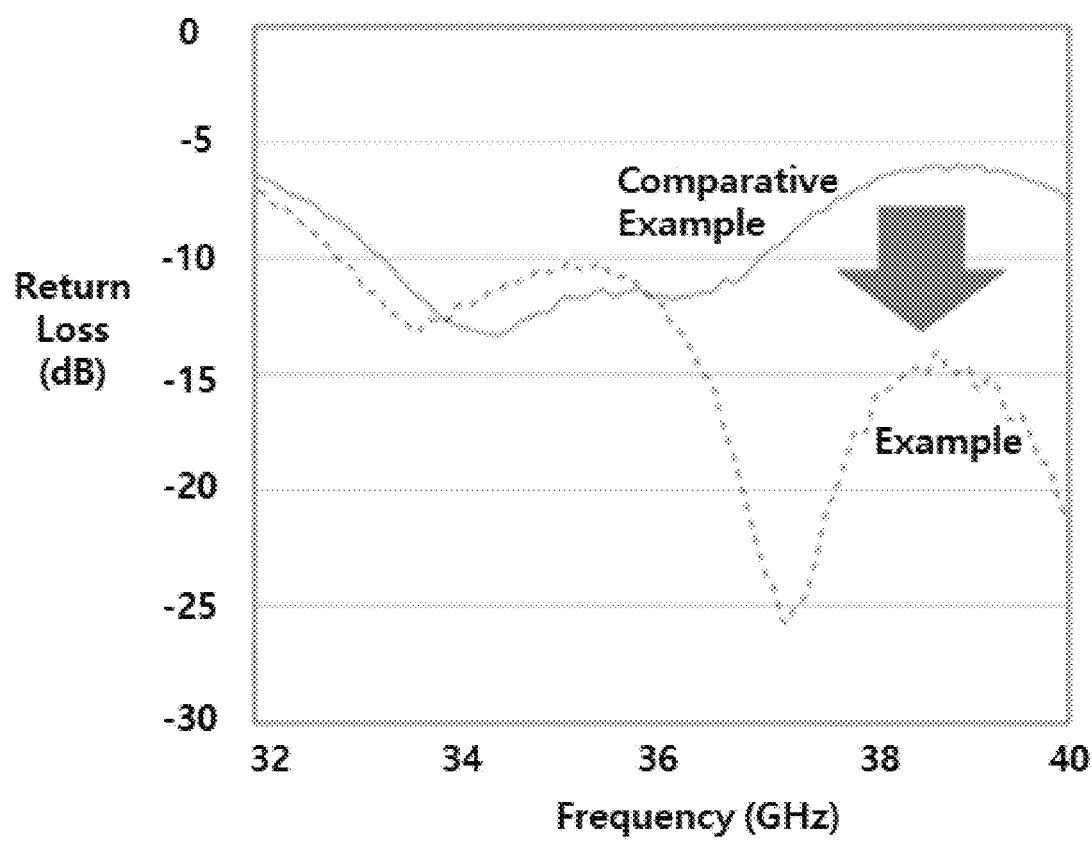
FIGS. 7 and 8 are graphs showing changes of a signal loss and an antenna gain based on a frequency simulated using an impedance converter according to Example and Comparative Example, respectively.
Figure 8:
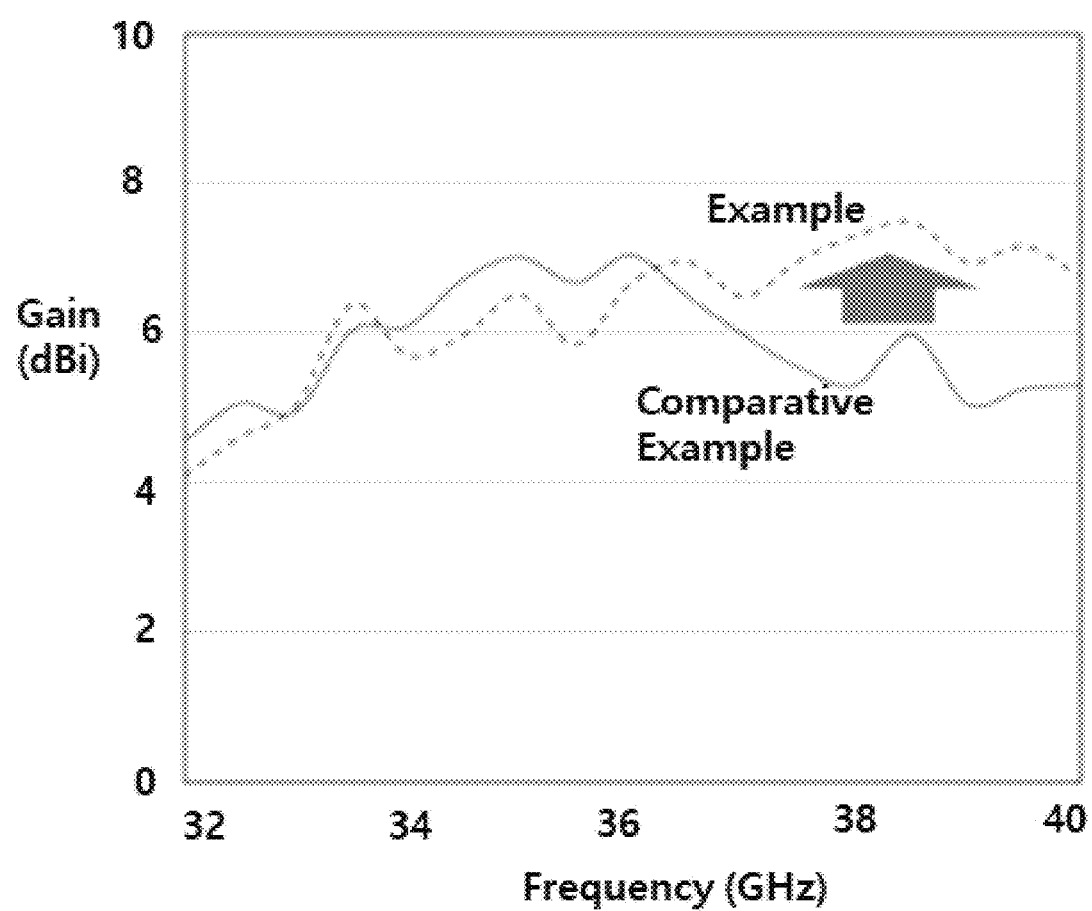

FIGS. 7 and 8 are graphs showing changes of a signal loss and an antenna gain based on a frequency simulated using an impedance converter according to Example and Comparative Example, respectively.

Referring to FIGS. 7 and 8, as indicated by arrows, in Example where the impedance converter including the impedance modulator was used, the signal loss was explicitly reduced in a high frequency band ranging from 36 GHz or more or from 36 GHz to 40 GHz, and the antenna gain was increased.

What is claimed is:

1. An impedance converter for an antenna, comprising:
a first port configured to receive a power from an antenna driving integrated circuit;
an impedance modulator connected to the first port and configured to convert an impedance; and
a second port connected to the modulator and configured to perform a feeding to an antenna unit, the second port having an impedance higher than an impedance of the first port.

2. The impedance converter for an antenna of claim 1, wherein the impedance modulator comprises a first modulator disposed to be adjacent to the first port, and a second modulator disposed to be adjacent to the second port.

3. The impedance converter for an antenna of claim 2, further comprising:
a first signal wiring connecting the first port and the first modulator;
a second signal wiring connecting the first modulator and the second modulator and comprising branched wirings; and
a third signal wiring connecting the second modulator and the second port and comprising feeding wirings.

4. The impedance converter for an antenna of claim 3, wherein the second modulator is connected to each of the branched wirings, and a plurality of the feeding wirings are branched from the second modulator.

5. The impedance converter for an antenna of claim 4, wherein the second port comprises a plurality of second ports, each of which is connected to each end portion of the feeding wirings.

6. The impedance converter for an antenna of claim 5, wherein the first port has a first impedance, the second signal wiring has a second impedance greater than the first impedance, and the first modulator has a first modulating impedance smaller than each of the first impedance and the second impedance.

7. The impedance converter for an antenna of claim 6, wherein the first modulating impedance satisfies Equation 1-1:

$$\sqrt{\frac{Z_2}{2} * Z_1} - 2\Omega \leq T_1 \leq \sqrt{\frac{Z_2}{2} * Z_1} + 2\Omega \qquad \text{[Equation 1-1]}$$

wherein, in Equation 1-1, $Z_1$ and $Z_2$ are the first impedance and the second impedance, respectively, and $T_1$ is the first modulating impedance.

8. The impedance converter for an antenna of claim 6, wherein the third signal wiring and the second port has a third impedance; and
the second modulator has a second modulating impedance smaller than each of the second impedance and the third impedance.

9. The impedance converter for an antenna of claim 8, wherein the second modulating impedance satisfies Equation 3-1:

$$\sqrt{\frac{Z_3}{2} * Z_2} - 2\Omega \leq T_2 \leq \sqrt{\frac{Z_3}{2} * Z_2} + 2\Omega \qquad \text{[Equation 3-1]}$$

wherein, in Equation 3-1, $Z_2$ and $Z_3$ are the second impedance and the third impedance, respectively, and $T_2$ is the second modulating impedance.

10. The impedance converter for an antenna of claim 8, wherein the third impedance is determined based on Equation 2:

$$Z_2 = \sqrt{Z_3 * Z_1} \qquad \text{[Equation 2]}$$

wherein, in Equation 2, $Z_1$, $Z_2$ and $Z_3$ are the first impedance, the second impedance and the third impedance, respectively.

11. The impedance converter for an antenna of claim 1, further comprising:
a first signal wiring that is a single wiring connecting the first port and the impedance modulator; and
a second signal wiring that is a single wiring connecting the impedance modulator and the second port.

12. The impedance converter for an antenna of claim 11, wherein the first port has a first impedance, the second port has a second impedance greater than the first impedance, and the impedance modulator has a modulating impedance between the first impedance and the second impedance.

13. The impedance converter for an antenna of claim 12, wherein the modulating impedance satisfies Equation 5-1:

$$\sqrt{Z_1 * Z_2} - 2\Omega \leq T \leq \sqrt{Z_1 * Z_2} + 2\Omega \qquad \text{[Equation 5-1]}$$

wherein, in Equation 5-1, $Z_1$ and $Z_2$ are the first impedance and the second impedance, respectively, and T is the modulating impedance.

14. The impedance converter for an antenna of claim 1, wherein the impedance converter for an antenna is used in an antenna-on display (AOD) device.

15. An antenna module comprising:
the impedance converter of claim 1;
the antenna driving integrated circuit connected to the first port of the impedance converter; and
an antenna-on display (AOD) device coupled to the second port of the impedance converter.

16. An image display device comprising:
 a display panel having a display area and a peripheral area; and
 the antenna module of claim 15 combined with the display panel.

17. The image display device of claim 16, wherein the AOD device is disposed at least partially within the display area at a front portion of the image display device; and
 the impedance converter is bonded to the AOD device in the peripheral area, and is bent to a rear portion of the image display device to be connected to the antenna driving integrated circuit.

* * * * *